United States Patent
Li et al.

(10) Patent No.: US 11,334,181 B2
(45) Date of Patent: May 17, 2022

(54) DISPLAY PANEL, METHOD FOR DETECTING THE SAME, AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Baoran Li, Beijing (CN); Le Li, Beijing (CN); Bisheng Li, Beijing (CN); Chuanwen Zhang, Beijing (CN); Wenjin Fan, Beijing (CN); Tianyang Han, Beijing (CN)

(73) Assignees: Hefei Xinsheng Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/210,788

(22) Filed: Mar. 24, 2021

(65) Prior Publication Data
US 2021/0397319 A1    Dec. 23, 2021

(30) Foreign Application Priority Data
Jun. 19, 2020    (CN) .......................... 202010563216.4

(51) Int. Cl.
*G06F 3/041*    (2006.01)
*H01L 27/32*    (2006.01)
(Continued)

(52) U.S. Cl.
CPC ........ *G06F 3/04142* (2019.05); *G06F 3/0416* (2013.01); *H01L 27/3225* (2013.01); *H01L 51/0097* (2013.01); *G06F 3/042* (2013.01); *G06F 3/045* (2013.01); *G06F 3/046* (2013.01); *G06F 3/0447* (2019.05);
(Continued)

(58) Field of Classification Search
CPC .. G06F 3/04142; G06F 3/0416; G06F 3/0447; G06F 3/042; G06F 3/045; G06F 3/046; G06F 2203/04102; H01L 27/3225; H01L 51/0097; H01L 2251/5338; H04M 1/0268
See application file for complete search history.

(56) References Cited

U.S. PATENT DOCUMENTS

2006/0231837 A1 * 10/2006 Wuchse .............. H01L 27/3288
257/59
2010/0053073 A1 * 3/2010 Cohen .................. G06F 1/1643
345/156
(Continued)

*Primary Examiner* — Dmitriy Bolotin
(74) *Attorney, Agent, or Firm* — ArentFox Schiff LLP; Michael Fainberg

(57) ABSTRACT

The present disclosure provides a display panel, a method for detecting the same, and a display device. The display panel includes a bending region and a rigid region. The display panel includes at least three pressure-sensitive devices inside, and the at least three pressure-sensitive devices are at least partially overlapped with the bending region respectively. The display panel further includes a detection circuit, the detection circuit is electrically connected to the at least three pressure-sensitive devices via detection lines, and the detection circuit is configured to receive detection signals generated by the at least three pressure-sensitive devices.

9 Claims, 11 Drawing Sheets

(51) Int. Cl.
  *H01L 51/00* (2006.01)
  *G06F 3/044* (2006.01)
  *G06F 3/042* (2006.01)
  *G06F 3/045* (2006.01)
  *G06F 3/046* (2006.01)
  *H04M 1/02* (2006.01)
(52) U.S. Cl.
  CPC .............. *G06F 2203/04102* (2013.01); *H01L 2251/5338* (2013.01); *H04M 1/0268* (2013.01)

(56) References Cited

U.S. PATENT DOCUMENTS

| | | | | |
|---|---|---|---|---|
| 2010/0302128 | A1* | 12/2010 | Lin | G06F 3/0362 345/1.3 |
| 2013/0278624 | A1* | 10/2013 | Abe | G06F 1/1652 345/619 |
| 2014/0049464 | A1* | 2/2014 | Kwak | G06F 3/03 345/156 |
| 2014/0098075 | A1* | 4/2014 | Kwak | G06F 3/045 345/204 |
| 2014/0375660 | A1* | 12/2014 | Tamaki | G06F 3/0446 345/522 |
| 2015/0169091 | A1* | 6/2015 | Ho | G06F 3/0416 345/173 |
| 2015/0227173 | A1* | 8/2015 | Hwang | G06F 1/1652 345/619 |
| 2016/0109973 | A1* | 4/2016 | Kim | G06F 1/1652 345/173 |
| 2016/0190216 | A1* | 6/2016 | Yang | G02F 1/136286 257/91 |
| 2017/0060283 | A1* | 3/2017 | Sohn | G06F 3/041 |
| 2017/0123460 | A1* | 5/2017 | Jung | G06F 3/04166 |
| 2017/0141179 | A1* | 5/2017 | Kim | H01L 27/3279 |
| 2021/0173437 | A1* | 6/2021 | Bae | G06F 1/1626 |

* cited by examiner

DISPLAY PANEL, METHOD FOR DETECTING THE SAME, AND DISPLAY DEVICE

This application claims priority to China Patent Application No. 202010563216.4, filed on Jun. 19, 2020 in China National Intellectual Property Administration, which is hereby incorporated by reference in its entirety.

FIELD

The present disclosure relates to the technical field of displaying, and in particular to a display panel, a method for detecting the same, and a display device.

BACKGROUND

Due to the characteristics of high brightness, wide color gamut, high resolution, low power consumption, and the like, an organic light-emitting diode (OLED) display screen is regarded as the best choice for next-generation displays. Flexible OLEDs are flexible, unlikely to break, light in weight, and the like, which provide infinite possibilities for display forms in future displaying. In recent years, as a flexible OLED technology develops, flexible screens are getting closer and closer to us. Foldable mobile phones, curtain-like TVs, two-in-one mobile phone and computer products, and the like, will also enter thousands of households in the near future.

SUMMARY

Embodiments of the present disclosure provide a display panel, a method for detecting the same, and a display device. The display panel includes a bending region and a rigid region;

the display panel includes at least three pressure-sensitive devices inside, and the at least three pressure-sensitive devices are at least partially overlapped with the bending region respectively; and the display panel further includes a detection circuit; the detection circuit is electrically connected to the at least three pressure-sensitive devices via detection lines, and the detection circuit is configured to receive detection signals generated by the at least three pressure-sensitive devices.

In some embodiments, the display panel includes three pressure-sensitive devices inside; the three pressure-sensitive devices are a first pressure-sensitive device, a second pressure-sensitive device and a third pressure-sensitive device; the bending region is provided with a bending axis extending along a first direction; and the first pressure-sensitive device and the second pressure-sensitive device are distributed on two sides of the bending axis, and are symmetrically disposed along the bending axis.

In some embodiments, a center line of the third pressure-sensitive device and the bending axis coincide.

In some embodiments, center lines of the at least three pressure-sensitive devices and the bending axis coincide.

In some embodiments, the display panel has a display surface; the at least three pressure-sensitive devices are located on a side close to the display surface, or the at least three pressure-sensitive devices are located on a side away from the display surface; and the display surface is a convex surface or a concave surface in response to the display panel being bent.

In some embodiments, the display panel includes: a base substrate, and a source-drain metal layer located on the base substrate; and the detection lines and the source-drain metal layer are disposed on the same layer, and the at least three pressure-sensitive devices are electrically connected to the detection lines.

In some embodiments, the at least three pressure-sensitive devices are graphene sensors, resistance strain gauge sensors, semiconductor strain gauge sensors, piezoresistive pressure sensors, optical sensors, infrared sensors, ultrasonic sensors, inductive sensors or capacitive sensors.

Correspondingly, embodiments of the present disclosure further provide a display device, including the aforementioned display panel provided in the embodiments of the present disclosure.

Correspondingly, embodiments of the present disclosure further provide a method for detecting the aforementioned display panel, including:

detecting, by the detection circuit, the detection signals output by the at least three pressure-sensitive devices;

determining, by the detection circuit, a bending angle of the display panel according to the detection signals; and outputting, by the detection circuit, an instruction for controlling the display panel to execute a set operation according to the determined bending angle.

In some embodiments, the step of the detection circuit determining the bending angle of the display panel according to the detection signals includes:

comparing the detection signals output by the at least three pressure-sensitive devices with threshold ranges pre-stored correspondingly for obtaining bending angle measured values corresponding to the at least three pressure-sensitive devices, where the threshold ranges are corresponding relationships between the detection signals in set ranges and a bending angle, and the threshold ranges corresponding to the at least three pressure-sensitive devices on different positions are determined by positions of the at least three pressure-sensitive devices; and if the detection signals output by more than half of the at least three pressure-sensitive devices correspond to the same bending angle measured value, determining the same bending angle as the bending angle of the display panel.

DETAILED DESCRIPTION OF THE EMBODIMENTS

In order to make the objectives, technical solutions and advantages of the embodiments of the present disclosure clearer, the technical solutions in the embodiments of the present disclosure will be described clearly and completely below in conjunction with the accompanying drawings in the embodiments of the present disclosure. Obviously, the described embodiments are a part of the embodiments of the present disclosure, not all the embodiments. Based on the described embodiments of the present disclosure, all other embodiments obtained by those of ordinary skill in the art without creative work shall fall within the protection scope of the present disclosure.

Unless otherwise defined, technical terms or scientific terms used herein shall have ordinary meanings as understood by those ordinarily skilled in the art of the present disclosure. The words "first", "second" and similar words used in the specification and claims of the present disclosure do not denote any order, quantity or importance, but are merely used to distinguish different components. The word "including" or "includes" or the like means that the element or item preceding the word covers the element or object listed after the word and its equivalent, without excluding other elements or objects. "Inner", "outer", "upper", "lower" and the like are only used to denote relative position relationships. When an absolute position of a described object changes, the relative position relationship may also change correspondingly.

It should be noted that the sizes and shapes of all patterns in the accompanying drawings do not reflect real scales, and are merely to illustrate the contents of the present disclosure. Furthermore, same or similar numerals throughout indicate same or similar elements or elements with same or similar functions.

At the present, a foldable display device emerges with usage requirements of users, i.e., the display device has a bending region, so that the display device can be bent in the bending region. However, the folding degree of the foldable display device cannot be detected at the present.

Figure 1:
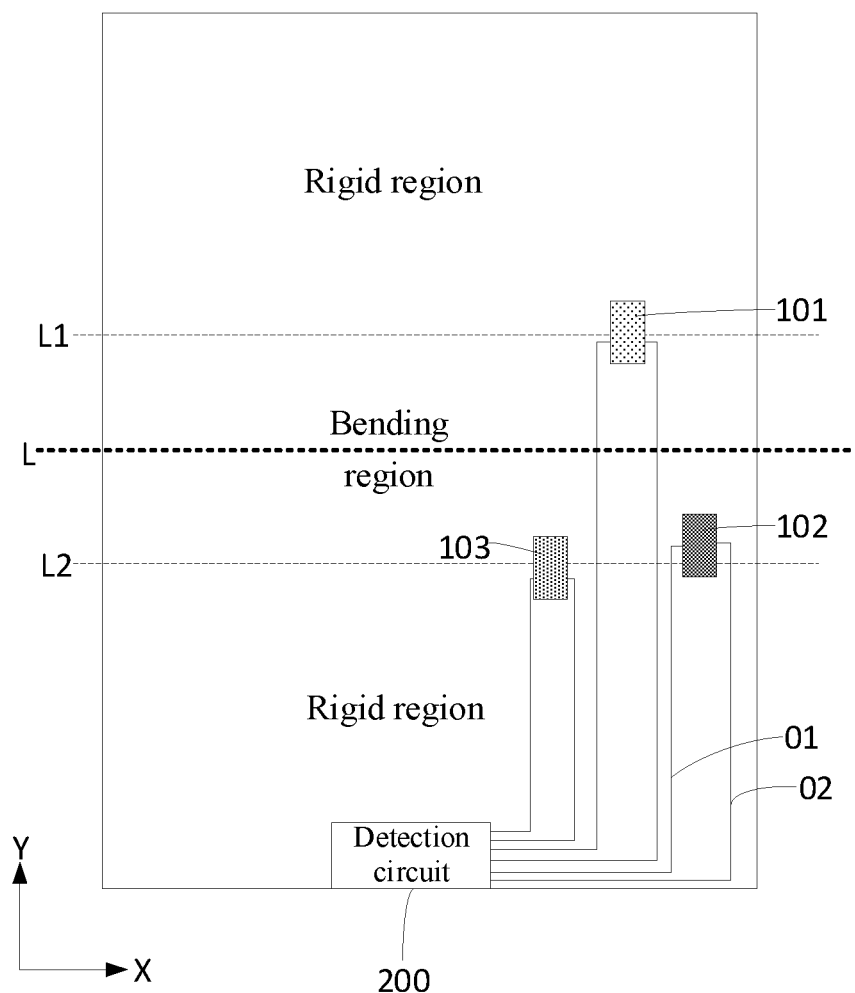
FIG. 1 is a schematic structural top view I of a display panel provided in embodiments of the present disclosure.
Figure 2:
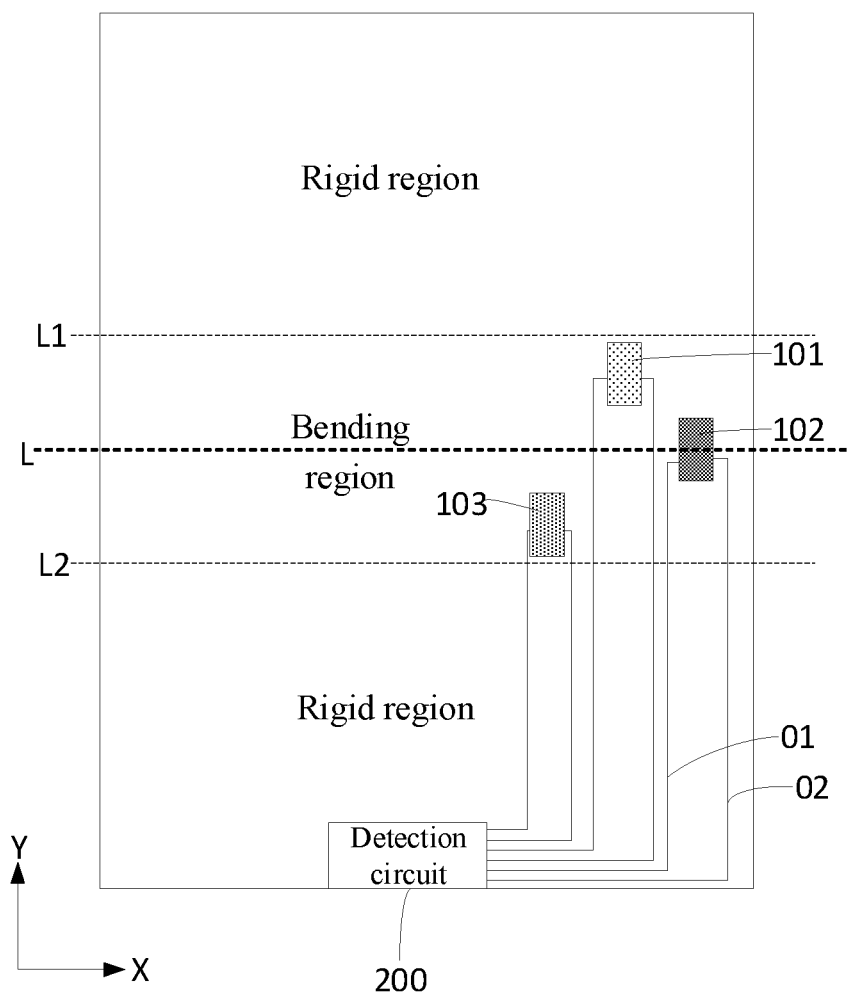
FIG. 2 is a schematic structural top view II of a display panel provided in embodiments of the present disclosure.

Therefore, in order to solve the problem that the folding degree of an existing foldable product cannot be detected in a bending process, embodiments of the present disclosure provide a display panel. As shown in FIG. 1 and FIG. 2, FIG. 1 and FIG. 2 respectively illustrate two schematic structural top views of a display panel. The display panel includes a bending region (a region located between a dotted line L1 and a dotted line L2) and a rigid region (a region other than the bending region). Specifically, the embodiments of the present disclosure are illustrated with an example in which one bending region is included, and the bending region divides the display panel into three parts (the bending region and regions on both sides of the bending region). Of course, the present disclosure is also applicable to an implementation mode in which a plurality of bending regions are included. The number of the bending region will not be limited herein.

The display panel includes at least three pressure-sensitive devices inside, and the at least three pressure-sensitive devices are at least partially overlapped with the bending region respectively. In both FIG. 1 and FIG. 2, the embodiments of the present disclosure are described with an example in which three pressure-sensitive devices (101, 102, 103) are provided. The pressure-sensitive devices (101, 102, 103) may deform when bending or pressing occurs, and corresponding detection signals may be generated. For example, if a bending angle is larger, the change ranges of the generated detection signals are larger relative to a non-bending situation, so that the bending angle of the display panel can be determined according to the intensities of the detection signals.

The display panel further includes a detection circuit 200. The detection circuit 200 is electrically connected to the pressure-sensitive devices (101, 102, 103) via detection lines. The detection lines include receiving detection lines 01 and transmitting detection lines 02. Each of the pressure-sensitive devices (101, 102, 103) is correspondingly electrically connected to the detection circuit 200 via one receiving detection line 01 and one transmitting detection line 02. Detection signals generated by the pressure-sensitive devices (101, 102, 103) are output through the transmitting detection lines 02; the detection circuit 200 is configured to receive the detection signals generated by the pressure-sensitive devices (101, 102, 103) through the transmitting detection lines 02, and can determine the bending angle of the display panel according to the detection signals generated by the pressure-sensitive devices (101, 102, 103).

According to the display panel provided in the embodiments of the present disclosure, the at least three pressure-sensitive devices which are at least partially overlapped with the bending region are set, the at least three pressure-sensitive devices deform when the display panel is bent, and the pressure-sensitive devices output the detection signals, so that the detection circuit can determine the bending angle of the display panel according to the detection signals output by the pressure-sensitive devices, and then output an instruction for controlling the display panel to execute a corresponding operation according to the determined bending angle.

The aforementioned display panel provided in the embodiments of the present disclosure can be an OLED display panel. The OLED display panel realizes a folding function more easily due to better flexibility. It can be understood that the display panel provided in the embodiments of the present disclosure is not limited to the OLED display panel. For example, both a folding quantum dot light-emitting display panel and a micro-LED or mini-LED display panel are included in the disclosure of this application.

During specific implementation, the display panel can be bent along an extending direction of a bending axis L in FIG.

1 and FIG. 2. When the display panel is bent along the bending region, the pressure-sensitive devices (101, 102, 103) located in the bending region can bend with the bending of the display panel, thereby ensuring that the pressure-sensitive devices (101, 102, 103) can detect the deformation of the display panel and output the detection signals.

Specifically, as shown in FIG. 1 and FIG. 2, the detection circuit 200 is electrically connected to the pressure-sensitive devices (101, 102, 103). The detection circuit 200 can determine the bending angle of the display panel according to integrated data of the detection signals output by the pressure-sensitive devices (101, 102, 103). For example, a threshold range corresponding to each pressure-sensitive device may be pre-stored. The threshold range is a corresponding relationship between a detection signal in a set range and a bending angle, and threshold ranges corresponding to the pressure sensitive devices on different positions are determined by the positions of the pressure sensitive devices. For example, for a pressure-sensitive element that takes an output voltage as a physical quantity and is disposed on a certain position at least partially overlapped with the bending region, the corresponding threshold range is: a correspondence between a detection signal of 1 V to 1.2 V and a bending angle of 30°, a correspondence between a detection signal of 2 V to 2.2 V and a bending angle of 45°, a correspondence between a detection signal of 3 V to 3.2 V and a bending angle of 60°, and the like. In addition, when the bending angle is the same, in a region that is at least partially overlapped with the bending region, the threshold ranges corresponding to the pressure-sensitive devices on the different positions are possibly different. For example, when the same bending angle is 30°, the detection signal of one pressure-sensitive device ranges from 1 V to 1.2 V, and the detection signal of another pressure-sensitive device on a different position may range from 1.4 V to 1.6 V. If the detection signals output by more than half of the pressure-sensitive devices correspond to the same bending angle measured value, for example, if the bending angles corresponding to the detection signals output by two of three pressure-sensitive devices are both 30°, the bending angle 30° is the bending angle of the display panel.

It can be understood that the corresponding relationship between the above threshold range and the bending angle is only illustrative. Actual physical quantities of the specific detection signals and corresponding relationships between the threshold ranges and the bending angles can be selected according to specific forms and sensitivities of the pressure-sensitive devices.

Specifically, as shown in FIG. 1, FIG. 1 illustrates that three pressure-sensitive devices (101, 102, 103) are randomly distributed in the bending region, and the three pressure-sensitive devices are only partially overlapped with the bending region. A system pre-stores corresponding relationships between detection signals in set ranges corresponding to the pressure-sensitive devices and bending angles. When the display panel is bent, the three pressure-sensitive devices (101, 102, 103) are bent to deform and respectively generate detection signals. The system compares the detection signals output by the pressure-sensitive devices with the pre-stored threshold ranges to obtain bending angle measured values corresponding to the pressure-sensitive devices. If the bending angle measured values output by at least two of the pressure-sensitive devices are the same, the same bending angle is determined as the bending angle of the display panel.

During specific implementation, the pressure-sensitive devices in FIG. 1 are only partially overlapped with the bending region, so that detection signals output by the pressure-sensitive devices are smaller, and the sensitivity of detection for the bending angle is lower. Therefore, in order to improve the sensitivity of detection, as shown in FIG. 2, FIG. 2 illustrates that three pressure-sensitive devices (101, 102, 103) are randomly distributed in the bending region, and the three pressure-sensitive devices are all located in the bending region. The bending angle detection principle of the structure in FIG. 2 is the same as that of the structure in FIG. 1, but differs in: the change ranges of the detection signals output by the pressure-sensitive devices in FIG. 2 are larger during bending, which can improve the sensitivity of detection. The specific detection principle refers to the above description of the structure in FIG. 1, and no detailed description will be made herein.

However, in the bending process of the display panel, a user often touches it by mistake (such as pressing it with fingers by mistake), or when a display screen is integrated with a touch function, one or more pressure-sensitive devices would be possibly pressed during touching. When the one or more pressure-sensitive devices at least senses a pressure caused by a pressing operation, the detection signal output by the pressed pressure-sensitive device may not correspond to a correct bending angle, but if the detection signals output by most of the pressure-sensitive devices correspond to the same bending angle, the same bending angle is determined as the bending angle of the display panel. However, if it is detected that none of the bending angle measured values corresponding to the detection signals output by the pressure-sensitive devices reaches or exceeds half, the bending angle at this moment cannot be determined, and determination for the bending angle is not performed. It can be considered that the bending angle of the display panel at this moment is the bending angle of the display panel at the latest moment that the bending angle can be determined before this moment.

Figure 3:
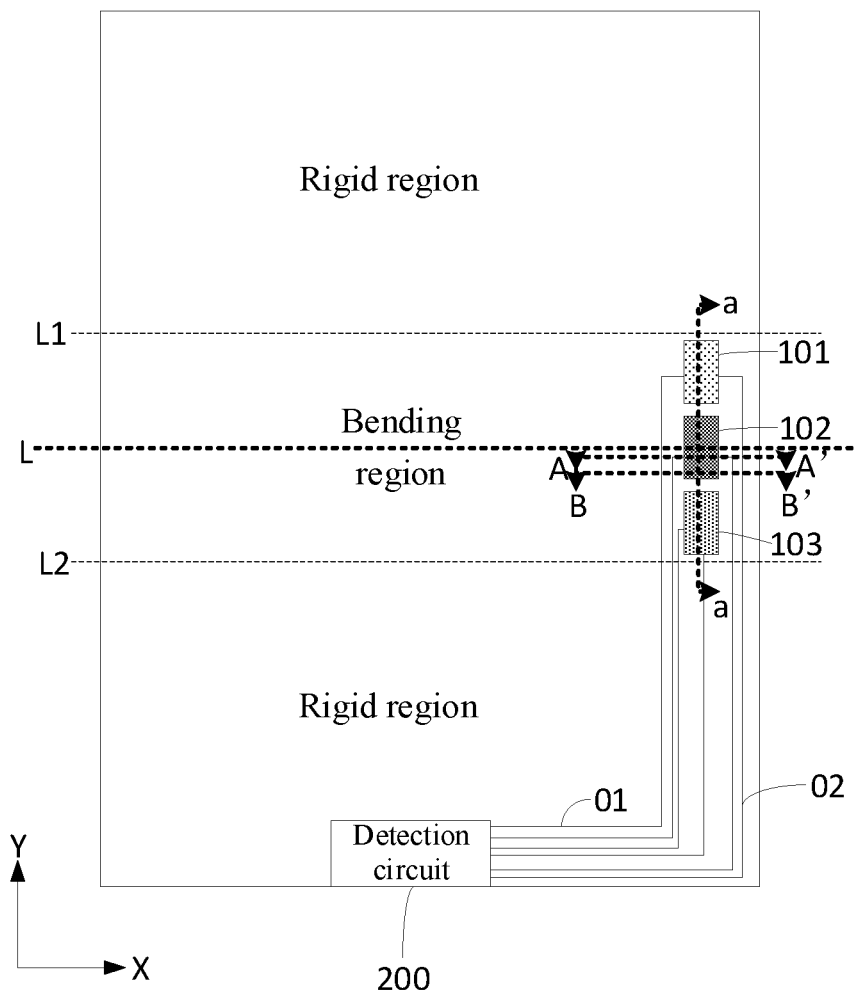
FIG. 3 is a schematic structural top view III of a display panel provided in embodiments of the present disclosure.

However, how to correct displaying after mis-touch occurs in the bending process is vitally important. Since the pressure-sensitive devices in FIG. 1 and FIG. 2 are randomly distributed in the display panel, the threshold ranges corresponding to the pressure-sensitive devices at each bending angle are different. During actual application, it is more complicated. Therefore, in order to facilitate determining a mis-touch operation state according to the detection signals output by the pressures-sensitive devices and correcting the displaying after the mis-touch occurs in the bending process, in the aforementioned display panel provided in the embodiments of the present disclosure, as shown in FIG. 3, the bending region is provided with a bending axis L extending along a first direction X. The at least three pressure-sensitive devices (101, 102, 103) are sequentially arranged along a second direction Y. The first direction X is perpendicular to the second direction Y.

During specific implementation, in order to further facilitate determining a mis-touch operation state according to the detection signals output by the pressures-sensitive devices and correcting the displaying after the mis-touch occurs in the bending process, in the aforementioned display panel provided in the embodiments of the present disclosure, as shown in FIG. 3, there may be three pressure-sensitive devices (101, 102, 103) such as a first pressure-sensitive device (101), a second pressure-sensitive device (103) and a third pressure-sensitive device (102). The bending region is provided with a bending axis L extending along a first direction X. The first pressure-sensitive device (101) and the second pressure-sensitive device (103) are distributed on two sides of the bending axis L, and are symmetrically disposed along the bending axis L. As such, the pressure-sensitive devices (101, 103) may be set to have a corresponding relationship between the same bending angle and an output signal threshold range. Furthermore, when the pressure-sensitive devices (101, 103) have the same detection signals, the detection signal of any one of the pressure-sensitive devices (101, 103) is directly used to determine a bending state of the display panel, simplifying the determination for the bending state. In case of mis-touch or a touch operation, when a pressure is applied to one of the pressure-sensitive devices (101, 103), the pressure-sensitive devices (101, 103) output different detection signals. At this time, the detection signal of the pressure-sensitive device (102) needs to be used, and the determination for the bending state can be completed by only using the threshold range corresponding to the detection signal of the pressure-sensitive device (102), also simplifying the determination for the bending state.

In some embodiments, as shown in FIG. 3, a center line of the third pressure-sensitive device 102 and the bending axis L coincide. As such, the third pressure-sensitive device 102 can be located on a position where a bending change is the greatest, enhancing the sensitivity to the bending angle.

Figure 4A:
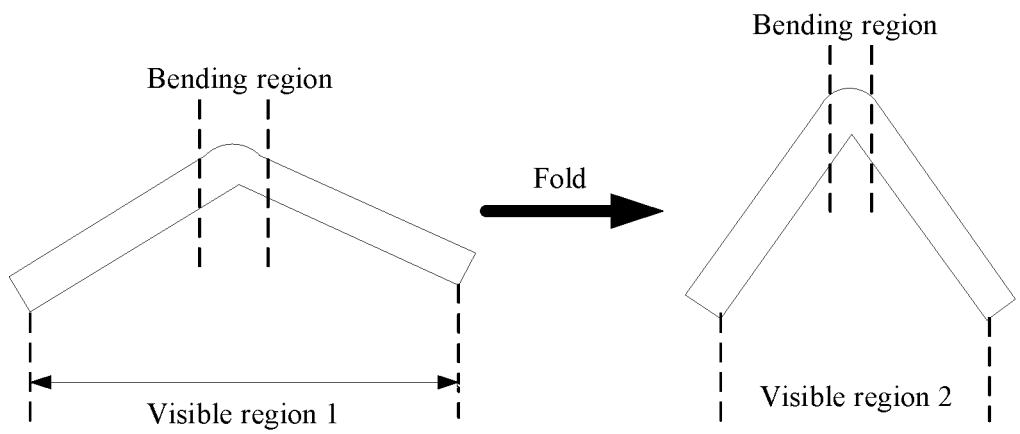
FIG. 4A is a schematic diagram of a bending process of a display panel in the prior art.
Figure 4B:
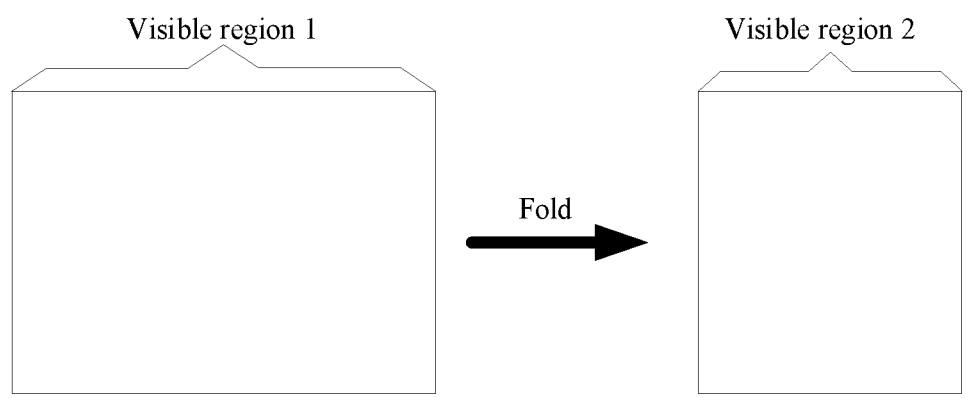
FIG. 4B is a schematic top view corresponding to the bending process in FIG. 4A.

Generally, only one pressure-sensitive element is disposed in the bending region in the prior art, and a detection signal output by the pressure-sensitive element is used to determine the size of the bending angle of the display panel. There is not a mis-touch prevention function in the setting in the prior art. When the display device needs to change a display image or publish other instructions via a bending angle, a display error or an instruction error is often caused due to the fact that a real bending angle in a current state cannot be obtained. For example, in the bending process, referring to a bending opening angle state of the left view in FIG. 4A, if a pressure is applied to the pressure-sensitive devices in the bending region, and the state of the pressure and the bending angle is just equal to the bending state of the right view in FIG. 4A, at this time, the display state shall change from a visible region 1 to a visible region 2 in FIG. 4B, but an actual display condition of a product should be in the visible region 1, leading to a display error. For the present disclosure, if the mis-touch operation occurs on the position of the pressure-sensitive device 101 in FIG. 3, the detection circuit 200 detects at this time that numerical values for the pressure-sensitive device 101 and the pressure-sensitive device 103 do not match, and this phenomenon can be sensed by the display device. Specifically, for example, in case of no mis-touch in the bending process, the detection signals output by the pressure-sensitive device 101 and the pressure-sensitive device 103 shall be the same. When mis-touch occurs on the position of the pressure-sensitive device 101, the detection signal output by the pressure-sensitive device 101 is a superposed signal of a detection signal generated during bending and a detection signal generated during pressing. At this time, an IC feeds back to the system that the detection signal of the pressure-sensitive device 101 and the detection signal of the pressure-sensitive device 103 are different, and at least one pressure-sensitive device is pressed. At this time, the system adjusts the display image according to the numerical value of the detection signal of the pressure-sensitive device 102 to realize self-correction, ensuring the stability of a folding product.

Therefore, the way of determining the mis-touch operation state by using the structure shown in FIG. 3 and of how to correct the displaying after the mis-touch occurs in the bending process is simpler. That is, the threshold ranges correspondingly stored in the pressure-sensitive device 101 and the pressure-sensitive device 103 are the same, and the threshold range correspondingly stored in the pressure-sensitive device 102 is different from those of the pressure-sensitive devices 101 and 103, so that it is convenient to compare the threshold ranges.

Figure 5:
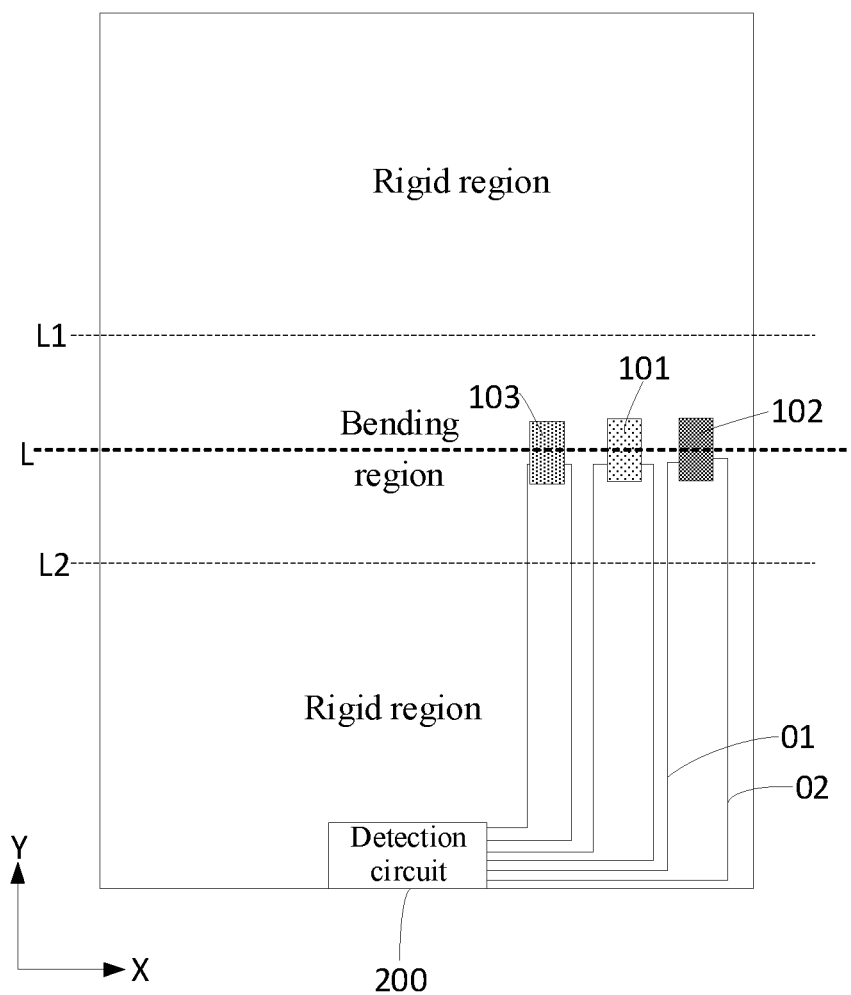
FIG. 5 is a schematic structural top view IV of a display panel provided in embodiments of the present disclosure.

In addition, FIG. 3 illustrates that three pressure-sensitive devices are arranged along an extending direction perpendicular to a bending axis L. Of course, the three pressure-sensitive devices may also be sequentially arranged along an extending direction of the bending axis L, as shown in FIG. 5, and the three pressure-sensitive devices (101, 102, 103) are distributed in the bending region along the extending direction of the bending axis L. During normal bending, the detection signals output by the three pressure-sensitive devices are the same. In this way, the pre-stored threshold ranges corresponding to the three pressure-sensitive devices (101, 102, 103) are the same, realizing that the way of determining the bending angle is simpler. In case of mis-touch or pressing during bending, the bending angle may be determined according to the same detection signals output by most of the pressure-sensitive devices, so as to perform displaying at the determined bending angle. It can be understood that FIG. 5 illustrates three pressure-sensitive devices, but the number of the pressure-sensitive devices that can be used actually is not limited to this.

Figure 6:
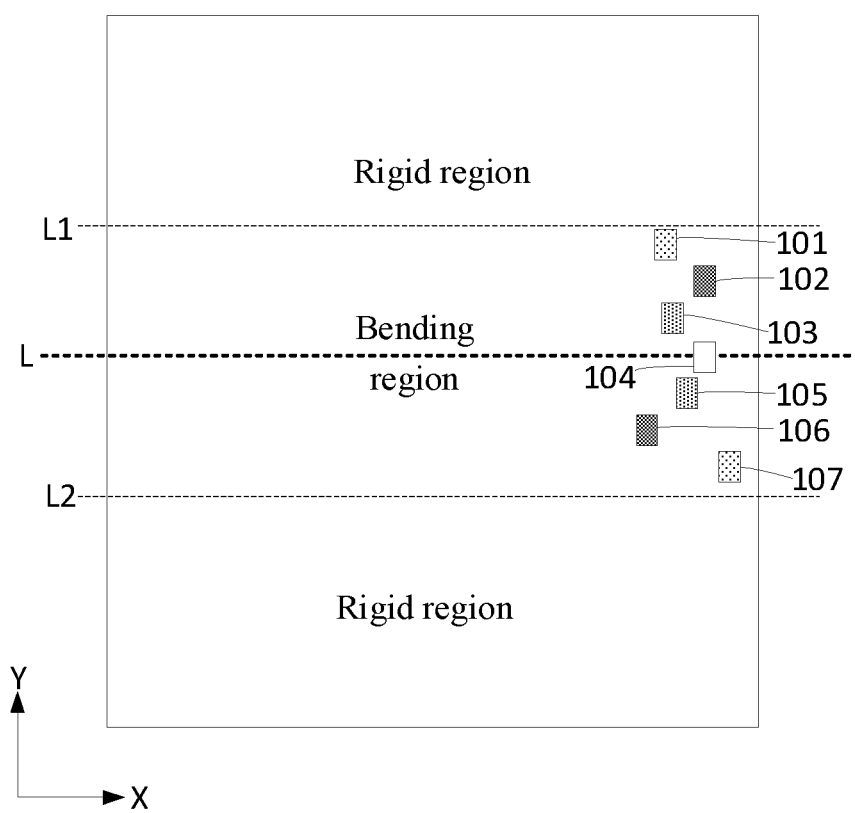
FIG. 6 is a schematic structural top view V of a display panel provided in embodiments of the present disclosure.

During specific implementation, FIG. 1 to FIG. 3 and FIG. 5 in the embodiments of the present disclosure all illustrate three pressure-sensitive devices. Of course, if there are more pressure-sensitive devices, the mis-touch prevention or touch misjudgment capability is higher. For example, five or seven pressure-sensitive devices can be disposed to prevent simultaneous mis-touch of multiple points or prevent touch misjudgment. As shown in FIG. 6, seven pressure-sensitive devices (101-107) are illustrated. The seven pressure-sensitive devices (101-107) in FIG. 6 are arranged randomly. The structure in FIG. 6 has the same principle as the structure in FIG. 1 for determining a bending angle and a mis-touch operation and correcting displaying, but only differs in: there is an increasing number of threshold ranges needing to be pre-stored in FIG. 6, i.e., each pressure-sensitive device pre-stores one group of threshold ranges. In case of bending only, the detection signals output by the pressure-sensitive devices are in respectively corresponding set ranges. In case of mis-touch during bending, if most (four or more than four) pressure-sensitive devices correspond to the same bending angle measured value, the same bending angle measured value is determined as the bending angle of the display panel, and corresponding operations may be executed according to the bending angle. In addition, compared with the above-mentioned embodiment in which three pressure-sensitive devices are provided, this embodiment can have a function of preventing simultaneous mis-touch of multiple points by providing more pressure-sensitive devices, such as the above-mentioned seven pressure-sensitive devices. It should be noted that FIG. 6 is only for the purpose of illustrating an arrangement mode of the pressure-sensitive devices, and elements such as the detection lines are not drawn like FIG. 1. During specific implementation, a film layer structure in FIG. 6 is the same as that in FIG. 1, but only differs in the number and positions of the pressure-sensitive devices.

During specific implementation, the display panel generally includes a display region and a peripheral region surrounding the display region. In the aforementioned display panel provided in the embodiments of the present disclosure, the pressure-sensitive devices may be all distributed in the display region, or may be all distributed in the peripheral region, or are distributed in both the display region and the peripheral region.

In some embodiments, all the pressure-sensitive devices are located in the bending region and the display region. In this way, an ultra narrow bezel design or a bezel-less design can be realized.

Of course, specific setting positions of the pressure-sensitive devices may also be selected according to an actual requirement.

During specific implementation, when all the pressure sensitive devices are located in the display region, if the pressure is applied to one or more pressure-sensitive devices during finger touch, a bending angle corresponding to the detection signal(s) output by the one or more pressure-sensitive devices applied with the pressure cannot reflect a real bending state. Since at least three pressure-sensitive devices are disposed in the present disclosure, the bending angle of the display panel may be determined according to the bending angle measured values corresponding to other pressure-sensitive devices to adjust the corresponding displaying, thereby preventing influences of touch to the determination for the bending angle of the display panel. The specific principle has been described above.

During specific implementation, when all the pressure-sensitive devices are located in the peripheral region, the pressure-sensitive devices may be disposed side by side with light-emitting devices in the display region to reduce the thickness. The pressure-sensitive devices may be disposed on sides, away from a light emitting surface, of the light-emitting devices in the display region when the pressure-sensitive devices are all located in the display region.

Figure 7A:
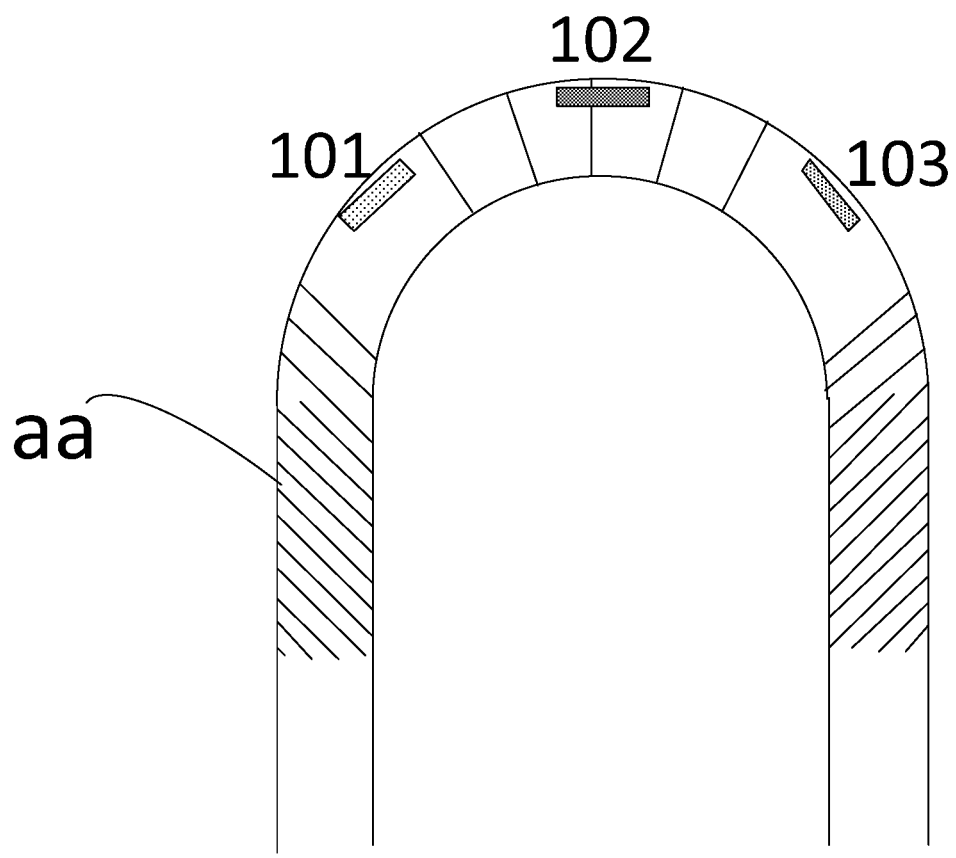
FIG. 7A is a schematic sectional diagram I of a display panel provided in embodiments of the present disclosure when the display panel is bent along a direction aa in FIG. 3.
Figure 7B:
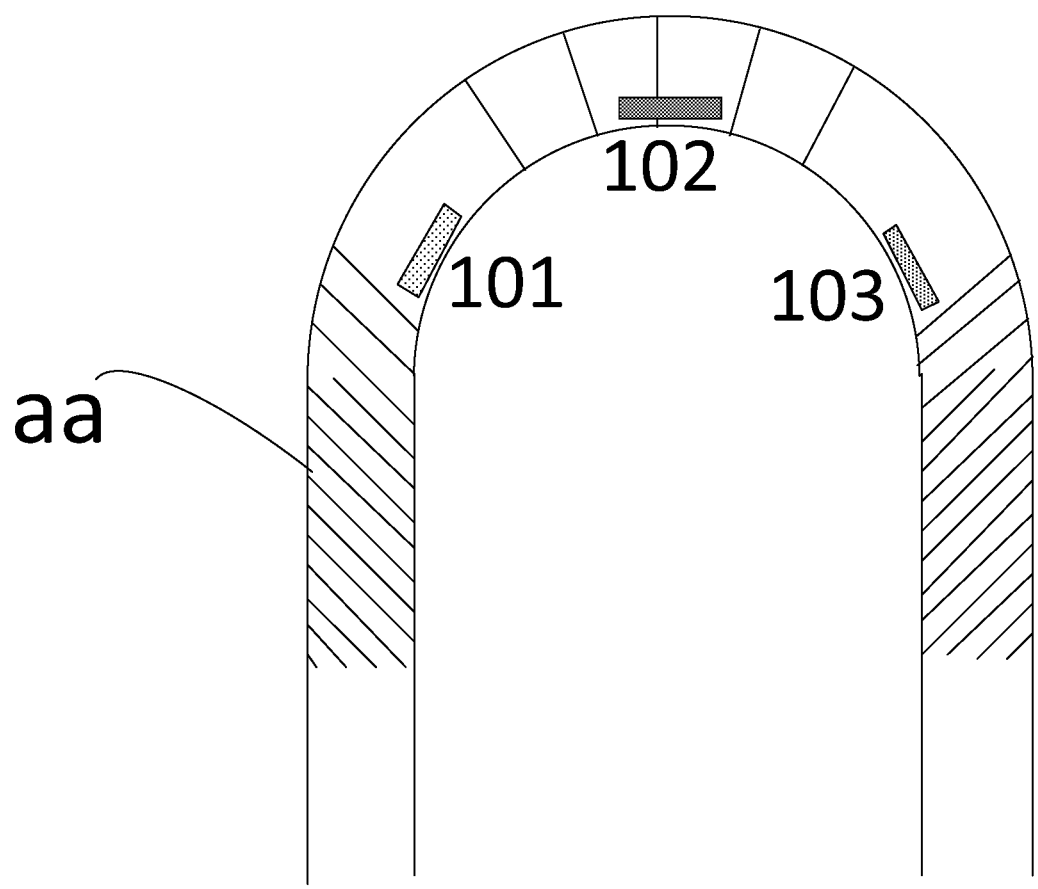
FIG. 7B is a schematic sectional diagram II of a display panel provided in embodiments of the present disclosure when the display panel is bent along a direction aa in FIG. 3.
Figure 7C:
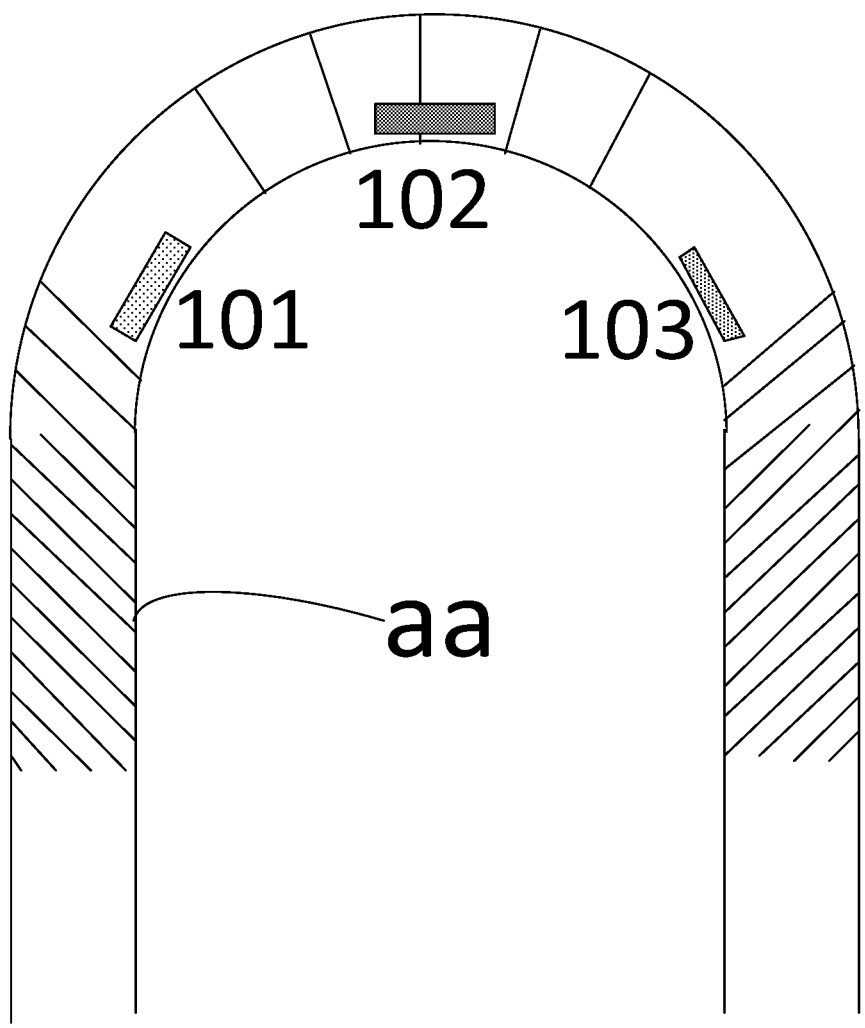
FIG. 7C is a schematic sectional diagram III of a display panel provided in embodiments of the present disclosure when the display panel is bent along a direction aa in FIG. 3.
Figure 7D:
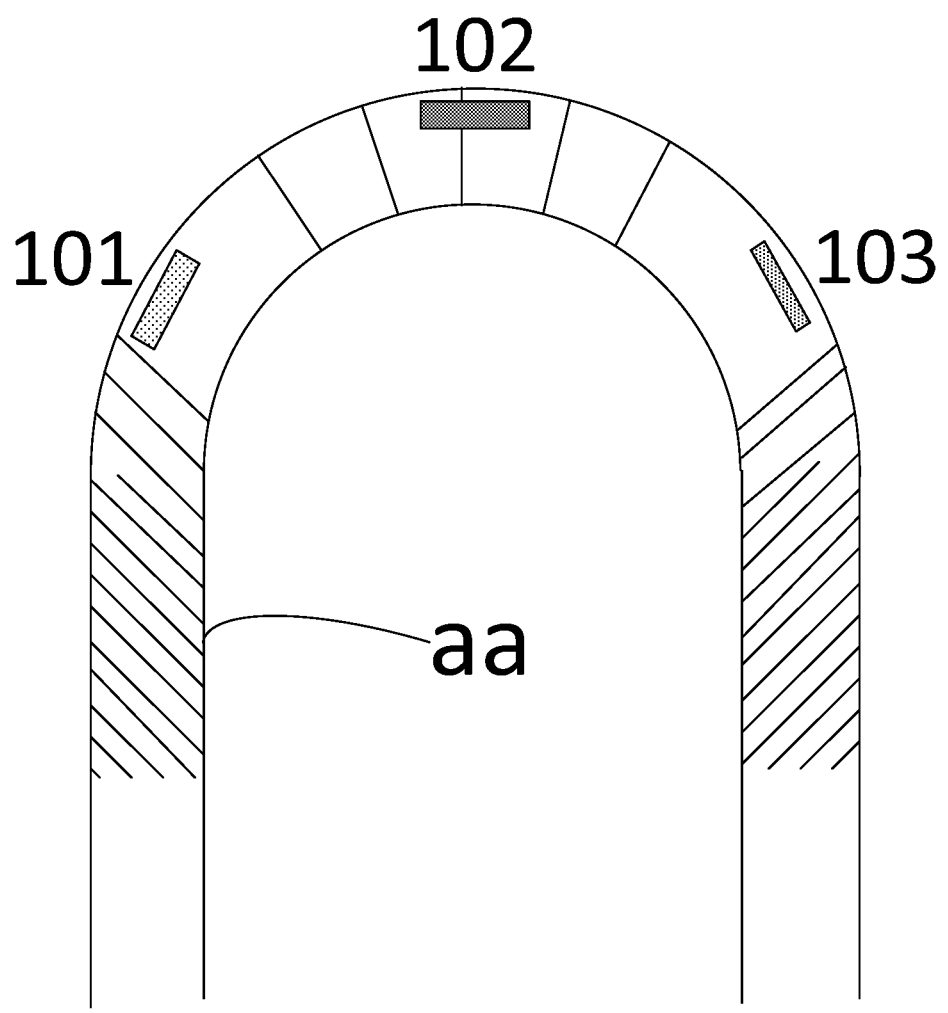
FIG. 7D is a schematic sectional diagram IV of a display panel provided in embodiments of the present disclosure when the display panel is bent along a direction aa in FIG. 3.

During specific implementation, in the aforementioned display panel provided in the embodiments of the present disclosure, the display panel has a display surface; all the pressure-sensitive devices are located on a side close to the display surface, or all the pressure-sensitive devices are located on a side away from the display surface; and the display surface is a convex surface or a concave surface in response to the display panel being bent. Specifically, as shown in FIG. 7A to FIG. 7D, FIG. 7A to FIG. 7D respectively illustrate four schematic structural diagrams after the display panel is bent. As shown in FIG. 7A, the display panel has a display surface aa; after the display panel is bent, the display surface aa is a convex surface; and all the pressure-sensitive devices (101, 102, 103) are located on a side close to the display surface aa. As shown in FIG. 7B, the display panel has a display surface aa; after the display panel is bent, the display surface aa is a convex surface; and all the pressure-sensitive devices (101, 102, 103) are located on a side away from the display surface aa. As shown in FIG. 7C, the display panel has a display surface aa; after the display panel is bent, the display surface aa is a concave surface; and all the pressure-sensitive devices (101, 102, 103) are located on a side close to the display surface aa. As shown in FIG. 7D, the display panel has a display surface aa; after the display panel is bent, the display surface aa is a concave surface; and all the pressure-sensitive devices (101, 102, 103) are located on a side away from the display surface aa. In this way, when the display panel is bent, the pressure-sensitive devices in FIG. 7A and FIG. 7D are stretched, and the pressure-sensitive devices in FIG. 7B and FIG. 7C are compressed. For both compression and stretching, the pressure-sensitive devices deform and may output detection signals, thereby realizing the determination for the bending angle.

During specific implementation, in the aforementioned display panel provided in the embodiments of the present disclosure, as shown in FIG. 1 to FIG. 3, FIG. 5 and FIG. 6, the structure of each pressure-sensitive device may be a blocky structure. Of course, during specific implementation, the pressure-sensitive devices may also be other shapes, and no limitations are made herein. In some embodiments, the shapes of all the pressure-sensitive devices are the same.

Figure 8:
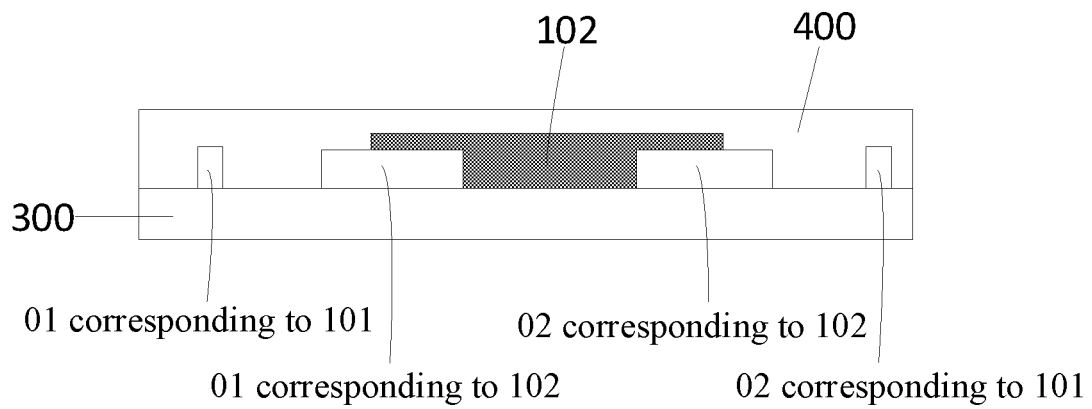
FIG. 8 is a schematic sectional diagram of a display panel provided in embodiments of the present disclosure along a direction AA' in FIG. 3.
Figure 9:
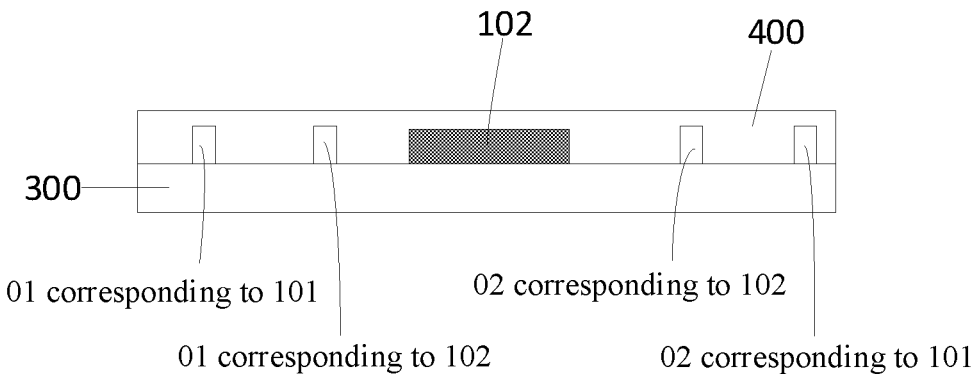
FIG. 9 is a schematic sectional diagram of a display panel provided in embodiments of the present disclosure along a direction BB' in FIG. 3.

During specific implementation, in the aforementioned display panel provided in the embodiments of the present disclosure, as shown in FIG. 8 and FIG. 9, FIG. 8 illustrates a schematic sectional diagram along a direction AA' in FIG. 3, and FIG. 9 is a schematic sectional diagram along a direction BB' in FIG. 3. FIG. 8 and FIG. 9 only illustrate sectional structures corresponding to the region of the pressure-sensitive device 102 located in the peripheral region. The display panel includes: a base substrate 300, and a source-drain metal layer (not shown) located on the base substrate 300.

The detection lines (the receiving detection lines 01 and the transmitting detection lines 02) and the source-drain metal layer are disposed on the same layer, and the pressure-sensitive devices (101, 102, 103) are electrically connected to the detection lines (the receiving detection lines 01 and the transmitting detection lines 02). In this way, original composition patterns are changed during formation of the source-drain metal layer, so that patterns of the detection lines and the source-drain metal layer can be formed by a one-time composition process without adding a process for separately preparing the detection lines; and therefore, the flow of the preparation process can be simplified, the production cost is reduced, and the production efficiency is increased.

Specifically, as shown in FIG. 8, the pressure-sensitive device (such as 102) is electrically connected to the detection lines (01, 02) in a lapping manner, i.e., the detection lines (01, 02) are formed while the source-drain metal layer is formed; and then, materials that form the pressure-sensitive devices are evaporated above the detection lines (01, 02) in a manner which may be plasma assisted chemical vapor deposition (PVCD) or coating.

During specific implementation, in the aforementioned display panel provided in the embodiments of the present disclosure, as shown in FIG. 8 and FIG. 9, a passivation layer 400 located on a side, facing away from the base substrate 300, of the pressure-sensitive device 102 is further included. Of course, other functional film layers familiar to those skilled in the art are further included, and no more details will be described herein.

During specific implementation, in the aforementioned display panel provided in the embodiments of the present disclosure, the pressure-sensitive devices may be graphene sensors, resistance strain gauge sensors, semiconductor strain gauge sensors, piezoresistive pressure sensors, optical sensors, infrared sensors, ultrasonic sensors, inductive sensors or capacitive sensors. Specifically, the pressure-sensitive devices in the embodiments of the present disclosure are preferably graphene sensors. Because the graphene sensors are higher in sensitivity, output detection signals change a lot when an external pressure is applied, for example, the display panel is bent, or in case of a touch, which is favorable for detection for the display panel.

It should be noted that the above-mentioned detection signals may be current signals or voltage signals generated by deformation of the pressure-sensitive devices when the display panel is bent. For example, when a graphene sensor and a resistance strain gauge sensor deform, their resistance values change; when the resistance values change while a voltage is constant, a current detected by the detection circuit changes; and when the resistance values change while a current is constant, a voltage detected by the detection circuit changes. When a capacitive sensor deforms, its charge and discharge frequency changes; for example, it is originally charged for 60 times within 1 min, but since the bending angles are different, it is charged for 50 times, 40 times, or the like within 1 min, i.e., power stored by a capacitor changes, and correspondingly, a signal detected by the detection circuit is a voltage signal or a current signal.

According to the above, a visible part of an existing folding product is gradually narrowing in a bending process, so that the visibility of the product is affected. In the embodiments of the present disclosure, at least three pressure-sensitive devices which are at least partially overlapped with the bending region are provided; the bending angle of the display panel is determined through the detection signals output by the pressure-sensitive devices; then, the instruction for controlling the display panel to execute the corresponding operation can be output according to the determined bending angle. For example, the display panel can be controlled to execute the corresponding operation according to a change tendency of the bending angle. For example, an operation for zooming up an image can be executed if it is detected that the bending angle is enlarged gradually, and an operation for zooming down an image can be executed if it is detected that the bending angle is decreased gradually. For example, when a screen of the display panel is opened or closed, it can be designed that the luminous brightness varies with the bending angle to enhance user experience. For example, when a user plays a game, such as a gunfight game, the speed that a character in the game moves can be controlled by using the bending angle; and if the bending angle is larger, the character moves faster. For example, a distance that a curtain in a room is pulled upwards or downwards can also be controlled according to the bending angle; for example, fluorescent lamps in which regions in a room can also be controlled, according to the bending angle, to be turned on and turned off. Of course, there may be other applications which are not enumerated herein.

Figure 10:
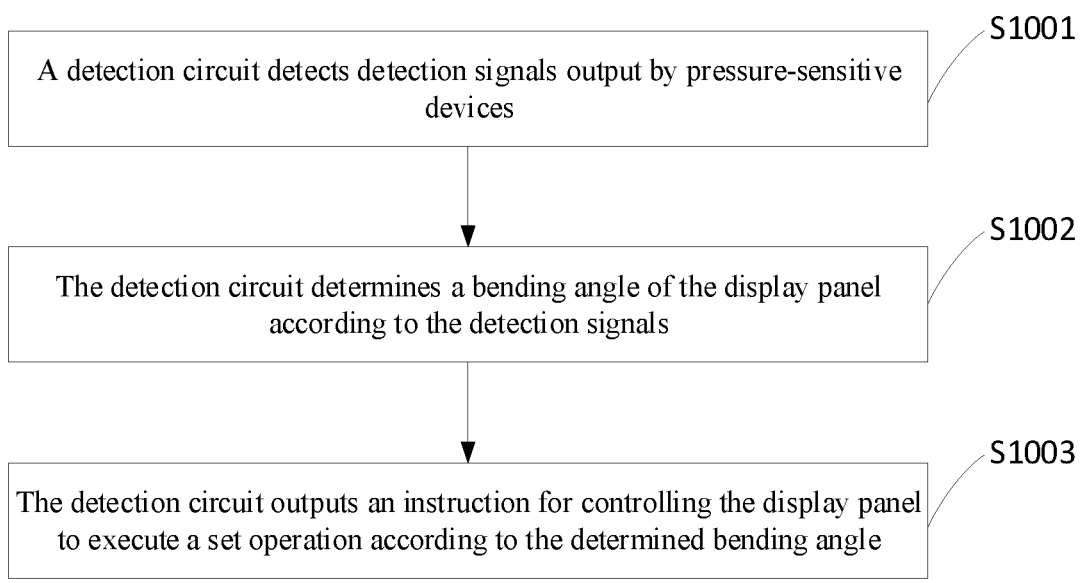
FIG. 10 is a flow diagram of a method for detecting a display panel provided in embodiments of the present disclosure.

Based on the same inventive concept, embodiments of the present disclosure further provide a method for detecting the aforementioned display panel. As shown in FIG. 10, the method may specifically include the following.

S1001, a detection circuit detects detection signals output by the pressure-sensitive devices.

S1002, the detection circuit determines a bending angle of the display panel according to the detection signals.

S1003, the detection circuit outputs an instruction for controlling the display panel to execute a set operation according to the determined bending angle.

According to the method for detecting the aforementioned display panel provided in the embodiments of the present disclosure, the detection circuit detects the detection signals output by the pressure-sensitive devices, determines the bending angle of the display panel according to the detection signals output by the pressure-sensitive devices, and outputs the instruction for controlling the display panel to execute the corresponding operation according to the determined bending angle, so that the visibility of a display image can be improved.

During specific implementation, in the aforementioned method provided in the embodiments of the present disclosure, the step that the detection circuit determines the bending angle of the display panel according to the detection signals may specifically include:

comparing the detection signals output by the pressure-sensitive devices with threshold ranges pre-stored correspondingly for obtaining bending angle measured values corresponding to the pressure-sensitive devices, where the threshold ranges are corresponding relationships between the detection signals in set ranges and a bending angle, and the threshold ranges corresponding to the pressure-sensitive devices on different positions are determined by positions of the pressure-sensitive devices; and if the detection signals output by more than half of the pressure-sensitive devices correspond to the same bending angle measured value, determining the same bending angle as the bending angle of the display panel.

During specific implementation, the detection principle of the method for detecting the display panel provided in the embodiments of the present disclosure is the same as the detection principle described in the display panel, and may refer to the description in the display panel, so that no repeated details will be described herein.

Based on the same inventive concept, embodiments of the present disclosure further provide a display device, including the aforementioned display panel provided in the embodiments of the present disclosure.

During specific implementation, the display device provided in the embodiments of the present disclosure may further include a flexible circuit board electrically connected to the display panel. The detection circuit may be disposed in the flexible circuit board. When the display panel is bent, internal structures of the detection circuit would not be affected, thereby ensuring the accuracy of an output result of the detection circuit. In addition, the detection circuit may also be disposed on other positions. For example, it can be integrated in a chip of the display device, and no limitation is made herein.

The display device may be: any product or component having a display function, such as a mobile phone, a tablet computer, a television, a display, a notebook computer, a digital photo frame and a navigator. The principle of the display device for solving problems is similar to that of the display panel, so that the implementation of the aforementioned display panel may refer to the implementation of the display panel, and repeated descriptions will be omitted herein.

According to the display panel, the method for detecting the same, and the display device provided in the embodiments of the present disclosure, the display panel includes a bending region and a rigid region. The display panel includes at least three pressure-sensitive devices inside, and the at least three pressure-sensitive devices are at least partially overlapped with the bending region respectively. The display panel further includes a detection circuit; the detection circuit is electrically connected to the pressure-sensitive devices via detection lines; and the detection circuit is configured to receive detection signals generated by the pressure-sensitive devices. In the present disclosure, due to the arrangement of the at least three pressure-sensitive devices, when the display panel is bent, the at least three pressure-sensitive devices output the detection signals, and the detection circuit can determine the bending angle of the display panel according to the detection signals output by the pressure-sensitive devices, and then output the instruction for controlling the display panel to execute the corresponding operation according to the determined bending angle, or enhance the visibility of a display image. Furthermore, influences of a mis-press or touch operation to correct determination for the bending angle of the display panel can be eliminated according to the detection signals output by the at least three pressure-sensitive devices.

Obviously, the embodiments described in the accompanying drawings are a part of the embodiments of the present disclosure, not all the embodiments. Those skilled in the art can make various changes and modifications to the present disclosure without departing from the spirit and scope of the present disclosure. Therefore, if these changes and modifications of the present disclosure fall within the scope of the claims of the present disclosure and equivalent technologies of the claims, the present disclosure is also intended to include these changes and modifications.

What is claimed is:

1. A display panel, comprising a bending region and a rigid region;
    wherein the display panel comprises at least three pressure-sensitive devices inside; and
    the at least three pressure-sensitive devices are at least partially overlapped with the bending region respectively;
    wherein the display panel further comprises a detection circuit;
    the detection circuit is electrically connected to the at least three pressure-sensitive devices via detection lines, and
    the detection circuit is configured to receive detection signals generated by the at least three pressure-sensitive devices to determine a bending angle of the display panel;
    wherein if the detection signals output by more than half of the at least three pressure-sensitive devices correspond to a same bending angle measured value, the same bending angle is determined as the bending angle of the display panel;
    wherein bending angle measured values corresponding to the at least three pressure-sensitive devices are obtained by comparing the detection signals output by the at least three pressure-sensitive devices with threshold ranges pre-stored correspondingly;
    wherein the threshold ranges are corresponding relationships between the detection signals in set ranges and a bending angle, and the threshold ranges corresponding to the at least three pressure-sensitive devices on different positions are determined by positions of the at least three pressure-sensitive devices.

2. The display panel according to claim 1, wherein the display panel comprises three pressure-sensitive devices inside;
    the three pressure-sensitive devices are a first pressure-sensitive device, a second pressure-sensitive device and a third pressure-sensitive device;
    the bending region is provided with a bending axis extending along a first direction; and
    the first pressure-sensitive device and the second pressure-sensitive device are distributed on two sides of the bending axis, and are symmetrically disposed along the bending axis.

3. The display panel according to claim 2, wherein a center line of the third pressure-sensitive device and the bending axis coincide.

4. The display panel according to claim 1, wherein center lines of the at least three pressure-sensitive devices and a bending axis coincide.

5. The display panel according to claim 1, wherein the display panel has a display surface;
    the at least three pressure-sensitive devices are disposed on a side close to the display surface, or the at least three pressure-sensitive devices are disposed on a side away from the display surface; and
    the display surface is a convex surface or a concave surface in response to the display panel being bent.

6. The display panel according to claim 1, comprising: a base substrate, and a source-drain metal layer disposed on the base substrate;
    wherein the detection lines and the source-drain metal layer are disposed on a same layer; and
    the at least three pressure-sensitive devices are electrically connected to the detection lines.

7. The display panel according to claim 1, wherein the at least three pressure-sensitive devices are graphene sensors, resistance strain gauge sensors, semiconductor strain gauge sensors, piezoresistive pressure sensors, optical sensors, infrared sensors, ultrasonic sensors, inductive sensors or capacitive sensors.

8. A method for detecting the display panel according to claim 1, comprising:
    detecting, by the detection circuit, the detection signals output by the at least three pressure-sensitive devices;
    determining, by the detection circuit, the bending angle of the display panel according to the detection signals; and
    outputting, by the detection circuit, an instruction for controlling the display panel to execute a set operation according to the determined bending angle.

9. A display device, comprising a display panel; wherein the display panel comprises a bending region and a rigid region;
    wherein the display panel comprises at least three pressure-sensitive devices inside; and
    the at least three pressure-sensitive devices are at least partially overlapped with the bending region respectively;
    wherein the display device further comprises a detection circuit;
    the detection circuit is electrically connected to the at least three pressure-sensitive devices via detection lines, and
    the detection circuit is configured to receive detection signals generated by the at least three pressure-sensitive devices to determine a bending angle of the display panel;
    wherein if the detection signals output by more than half of the at least three pressure-sensitive devices correspond to a same bending angle measured value, the same bending angle is determined as the bending angle of the display panel;
    wherein bending angle measured values corresponding to the at least three pressure-sensitive devices are obtained by comparing the detection signals output by the at least three pressure-sensitive devices with threshold ranges pre-stored correspondingly;
    wherein the threshold ranges are corresponding relationships between the detection signals in set ranges and a bending angle, and the threshold ranges corresponding to the at least three pressure-sensitive devices on different positions are determined by positions of the at least three pressure-sensitive devices.

* * * * *